United States Patent
Gooch et al.

(10) Patent No.: US 9,196,556 B2
(45) Date of Patent: Nov. 24, 2015

(54) GETTER STRUCTURE AND METHOD FOR FORMING SUCH STRUCTURE

(71) Applicant: Raytheon Company, Waltham, MA (US)

(72) Inventors: Roland Gooch, Dallas, TX (US); Adam M. Kennedy, Santa Barbara, CA (US); Stephen H. Black, Buellton, CA (US); Thomas Allan Kocian, Dallas, TX (US); Buu Diep, Murphy, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/193,437

(22) Filed: Feb. 28, 2014

(65) Prior Publication Data

US 2015/0249042 A1     Sep. 3, 2015

(51) Int. Cl.
*H01L 23/26*       (2006.01)
*B32B 3/10*        (2006.01)
*B32B 15/04*       (2006.01)

(52) U.S. Cl.
CPC . *H01L 23/26* (2013.01); *B32B 3/10* (2013.01); *B32B 15/04* (2013.01); *B32B 2255/205* (2013.01); *B32B 2457/00* (2013.01)

(58) Field of Classification Search
CPC .................................................. H01L 27/1214
USPC ......................................................... 438/162
See application file for complete search history.

(56) References Cited

U.S. PATENT DOCUMENTS

| 5,701,008 A | 12/1997 | Ray et al. | |
| 2006/0065327 A1* | 3/2006 | Buck | 148/325 |
| 2008/0054326 A1* | 3/2008 | Wong et al. | 257/300 |
| 2009/0081434 A1* | 3/2009 | Sturland et al. | 428/218 |
| 2011/0287214 A1* | 11/2011 | Reinert et al. | 428/119 |

FOREIGN PATENT DOCUMENTS

| EP | 1 898 442 A2 | 3/2008 |
| EP | 2 264 765 A1 | 12/2010 |
| WO | WO 2014/099123 A1 | 6/2014 |

OTHER PUBLICATIONS

PCT Notification of Transmittal of the International Search Report and the Written Opinion dated Jun. 2, 2015; for PCT Pat. App. No. PCT/US2015/016736; 1 page.
PCT Search Report of the ISA dated Jun. 2, 2015; for PCT Pat. App. No. PCT/US2015/016736; 4 pages.
PCT Written opinion of the ISA dated Jun. 2, 2015; for PCT Pat. App. No. PCT/US2015/016736; 5 pages.

* cited by examiner

*Primary Examiner* — Anthony Ho
(74) *Attorney, Agent, or Firm* — Daly, Crowley, Mofford & Durkee, LLP

(57) ABSTRACT

A getter structure and method wherein a layer of seed material is deposited on a predetermined region of a surface of a structure under conditions to form a plurality of nucleation sites on a surface of the structure. The nucleation sites have an average height over the surface area of the predetermined region of less than one molecule thick. Subsequently a getter material is deposited over the surface to form a plurality of getter material members projecting outwardly from the nucleation sites.

6 Claims, 6 Drawing Sheets

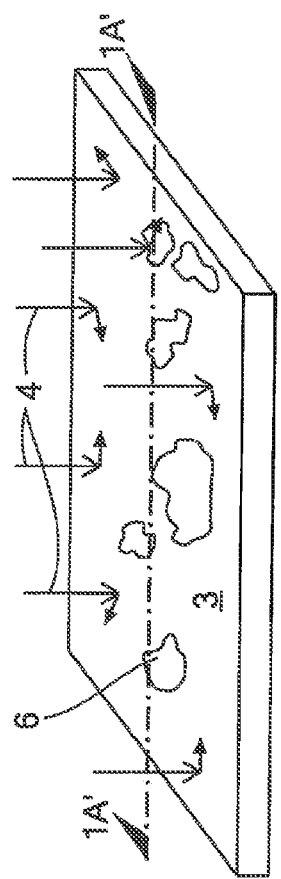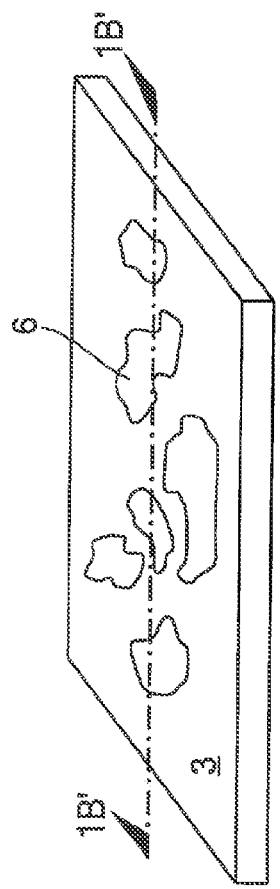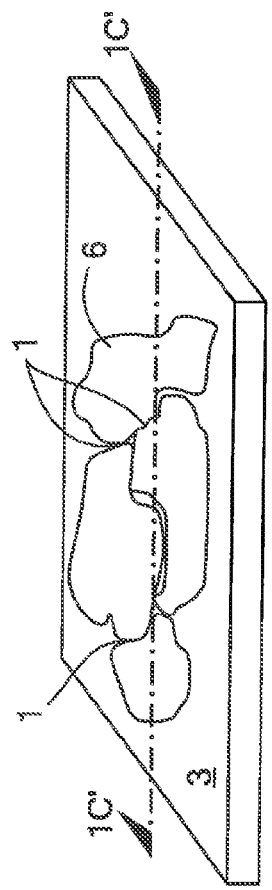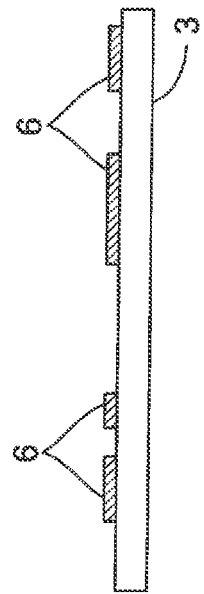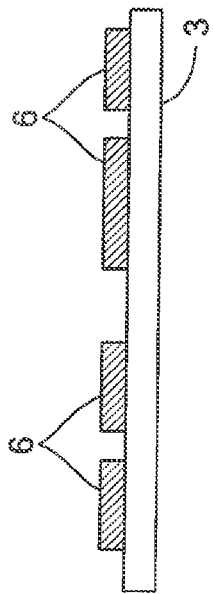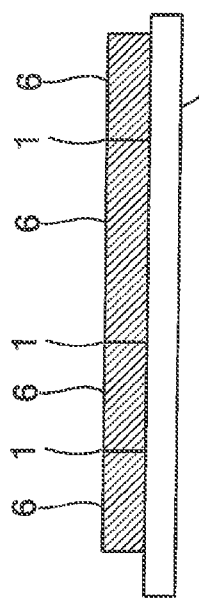

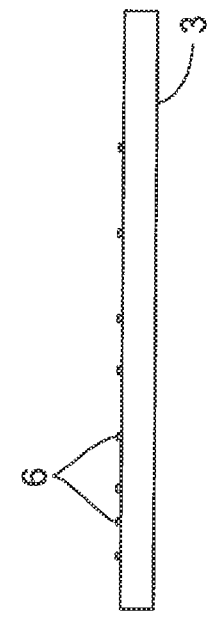 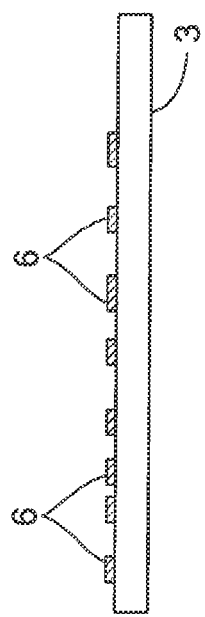 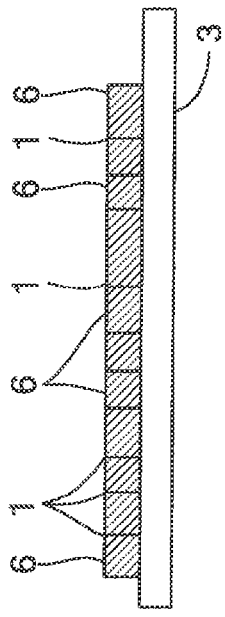
*FIG. 2A* PRIOR ART  *FIG. 2B* PRIOR ART  *FIG. 2C* PRIOR ART
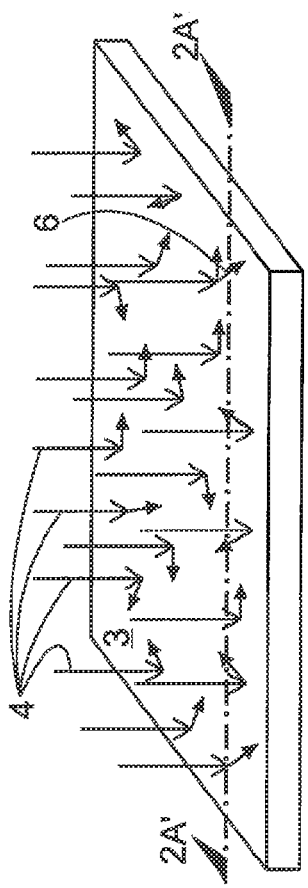 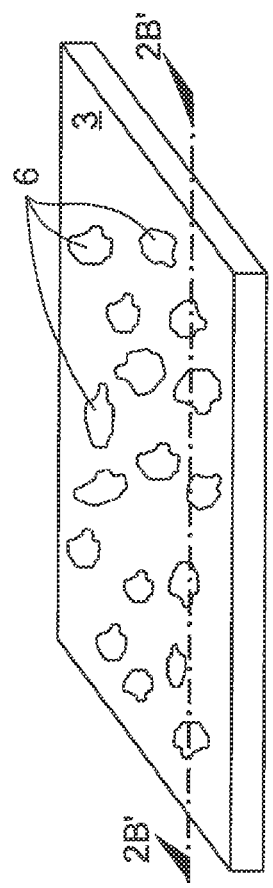 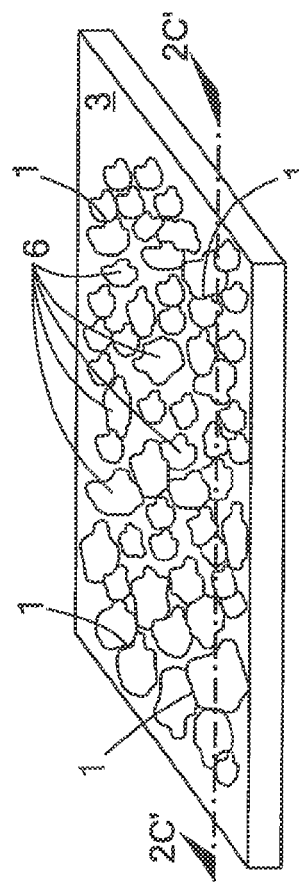
*FIG. 2A'* PRIOR ART  *FIG. 2B'* PRIOR ART  *FIG. 2C'* PRIOR ART

GETTER STRUCTURE AND METHOD FOR FORMING SUCH STRUCTURE

TECHNICAL FIELD

This disclosure relates generally to getter structures for vacuum packaged electronic devices and method for forming such structures.

BACKGROUND

As is known in the art, in order to maintain a high degree of vacuum in a sealed vacuum container, such as for example in so called a Dewar assembly, a getter has been used to trap gas molecules that slowly leak through the Dewar assembly seal or outgas from the container material. Widely used getter materials include titanium alone, and mixtures of titanium zirconium, vanadium, iron, and other reactive metals, which permanently capture various gas molecules such as oxygen, hydrogen, nitrogen, methane, carbon monoxide and carbon dioxide that are typically found in an outgassed vacuum-sealed Dewar assembly. The getter materials react with these gases to form oxides, carbides, hydrides and nitrides which are stable at room temperature. Therefore, the reactions are irreversible and do not involve the risk of future gas release.

There are two categories of vacuum getters, Evaporable getters and non-evaporable getters. Evaporable getters are flash evaporated in place onto the interior Dewar surface after the Dewar is sealed. A prime example is the shiny surface seen in a glass radio or TV vacuum tube. If subsequently exposed to air, the getter cannot be reactivated. A non-evaporable getter is installed or deposited in the process of fabricating the device in which it will serve, and activated by heating it to a high temperature for a short time. The subject of this application is in the non-evaporable category.

Trapping of residual gas molecules in a Dewar assembly has been achieved by conventional externally fired getters, an example of which is described in U.S. Pat. No. 5,111,049, inventors Romano et al. A getter material such as a porous mixture of titanium and molybdenum powders is placed within an Alloy 42 container, which is welded onto a tube protruding from the Dewar body. The getter material is activated by applying heat to the getter container at about 800 degrees C. for about 10 minutes. However, the externally fired getter is large and bulky, and must be fabricated external to the Dewar body. To maintain a high degree of vacuum in a Dewar assembly that contains a modern planar Infrared (IR) detector array, which is typically rectangular with dimensions generally on the order of 0.5 to 2 cm, the use of an externally fired getter greatly increases the volume and weight of the assembly. Moreover, the getter material must be located away from the IR detector array, and external cooling must be applied to the Dewar body to prevent thermal damage to the detector array and other Dewar assembly components caused by the heat supplied to the getter. The mechanical complexity of the getter assembly and the need for an external cooler for the IR detector array increases the cost of the IR detector.

A process for fabricating the vacuum-sealed Dewar assembly is described in U.S. Pat. No. 5,433,639. However, since the surface area of the deposited thin film getter is small, the amount of gas that can be removed by the getter is limited. Because the IR detectors preferably have a large fill factor which is the ratio of the detector surface area to the total detector surface area to increase the effectiveness of detection, the percentage of surface area upon which the getter material can be deposited is therefore relatively small.

As is also known in the art, a conventional uncooled IR detector array is housed in a vacuum-sealed Dewar assembly with a planar IR window, usually made of germanium and coated with a surface coating to improve its IR transmittance. IR radiation passes through the window and strikes the detector pixels in the array. Uncooled IR detectors are typically silicon or Vanadium Oxide microbolometers, which are temperature sensors that detect IR radiation by heat sensing.

As is also known in the art, integrating a getter into a wafer level vacuum packaged (WLVP) device that requires a large area optical window is very limited in available area to place the getter. In a wafer level packaged device the getter is usually vacuum deposited by evaporation or sputtering the getter material onto the device lid. In an optical device, such as an IR imaging Focal Plane Array (FPA), the window occupies most of the available area onto which the getter would be deposited.

One technique is described in U.S. Pat. No. 5,701,008. As described, therein, an increase in the surface area of getter is achieved by etching a multitude of trenches to form column-like protrusions in the cap wafer surface where the getter is to be placed. The getter is deposited conformally on the convoluted surface, thereby increasing its surface area by adding a third dimension to the two-dimensional surface area. The getter is deposited conformally by evaporation or sputtering onto the walls of the column-like protrusions as well as the planar horizontal surfaces. Other attempts involve methods to roughen the surface to increase the area slightly before depositing a getter.

As is also known in the art, one method for forming a getter is to sputter a film comprised of Zr, Ti, Fe and other metals co-deposited on a substrate.

As is also known in the art, a deposited vacuum getter is a structure (usually a thin layer) which is formed by evaporating or sputtering a layer of material that can react chemically with residual gas atoms in a vacuum environment to improve the vacuum quality. The morphology of the getter film is important as it must have as large an effective surface area as possible, onto which reactive gas species will be trapped. The gettering area is not only the geometrical area. Most of the active area is provided by the voids at the grain boundaries. The growth of deposited films has been studied extensively, resulting in the well-known Structure Zone Models (SZMs) of Movchan and Demchishin, and Thornton, see Handbook of Deposition Technologies for Thin Films and Coatings, P. M. Martin, Elsevier, 2009, ISBN 978-0-8155-2031-3. The SZM models relate film structure to the homologous temperature, defined as the ratio of film growth temperature to the melting temperature of the deposited material. A critical factor in the film grain growth is the mobility of the arriving atom on the substrate surface. The mobility has a strong dependence on the arriving energy and surface temperature. Atoms with high mobility (high energy) will move and agglomerate on the surface and form large grains. Atoms with low energy will stop sooner and form smaller grains, resulting in a net larger void space than in a film with large grains. Thus a film with many small grains is preferred over one with large grains with void spaces between them. A fast deposition rate also promotes smaller gains with void spaces in between grains. The chemical and thermodynamic properties of the material being deposited also will have an influence on the resultant gain structure.

This can be illustrated in FIGS. 1A, 1A'-1C, 1C' for the high mobility case with low deposition rate, and FIGS. 2A, 2A'-2C, 2C' for the lower mobility case with higher deposition rate. In FIGS. 1A, 1A' atoms 4 arrive on a surface 3 and move around until they lose enough energy to stop, or hit the edge of a cluster 6 of atoms which are the basis for forming a grain. Resultant grains are large as clusters grow sideways until they cover enough of the surface 3 to intercept an increasing number of arriving atoms 4 and start growing upward. The contact boundaries between grains 6 contains the void space 1 responsible for gettering action. In FIGS. 2C-2C', atoms 4 arrive on surface 3 and move around until they lose enough energy to stop, or hit the edge of a cluster. Clusters start growing upward quickly as atoms 4 arrive fast enough to pile up and quickly cover much of the surface and thus form small grains with grain boundaries (void space) 1 between them.

As is also known in the art, the effectiveness of vacuum deposited getters is strongly dependent upon the deposition method, deposition conditions, and resultant film morphology and structure. Vacuum getters for WLP and some other electronic packages consist of a layer of metal deposited in the package in a way that the gain structure forms tall columnar structures. The vertical surfaces between the grains are many times the geometrical area of the deposited getter and constitute most of the gettering surface.

SUMMARY

In accordance with the present disclosure, a getter structure is provided having: a substrate having a plurality of nucleation sites formed of a seed material on a surface of the substrate; and getter material members projecting outwardly from the nucleation sites.

In one embodiment, a wafer level vacuum packaged (WLVP) device is provided having: a first substrate having an array of detectors thereon; a second substrate vacuum bonded to the first substrate having a plurality of nucleation sites formed of a seed material on a surface of the second substrate; and getter material members projecting outwardly from the nucleation sites.

In one embodiment, a method is provided for forming a getter structure. The method includes: forming a plurality of nucleation sites of a seed material on a surface of the structure; and forming getter material members projecting outwardly from the nucleation sites.

In one embodiment, a method is provided for forming a getter structure. The method includes: depositing a layer of seed material on a surface of a structure under conditions to form a plurality of nucleation sites on a surface of the structure; and subsequently depositing a getter material over the surface to form a plurality of getter material members projecting outwardly from the nucleation sites.

In one embodiment, the layer of seed material is deposited over a region of the surface having a predetermined surface area and wherein the nucleation sites having an average height over the predetermined surface area less than one molecule thick.

In one embodiment, the deposition of the seed material is by flash evaporation or electron-beam deposition.

In one embodiment, the method includes oxidizing the nucleation sites prior to the getter material deposition.

DESCRIPTION OF DRAWINGS

FIGS. 1A, 1A'-1C, 1C' are sketches showing a process used to form gettering material according to the PRIOR ART where a relatively slow deposition is illustrated;

FIGS. 2A, 2A'-2C, 2C' are sketches showing a process used to for gettering material according to the PRIOR ART where a relatively high deposition is illustrated;

Like reference symbols in the various drawings indicate like elements.

DETAILED DESCRIPTION

Figure 3:
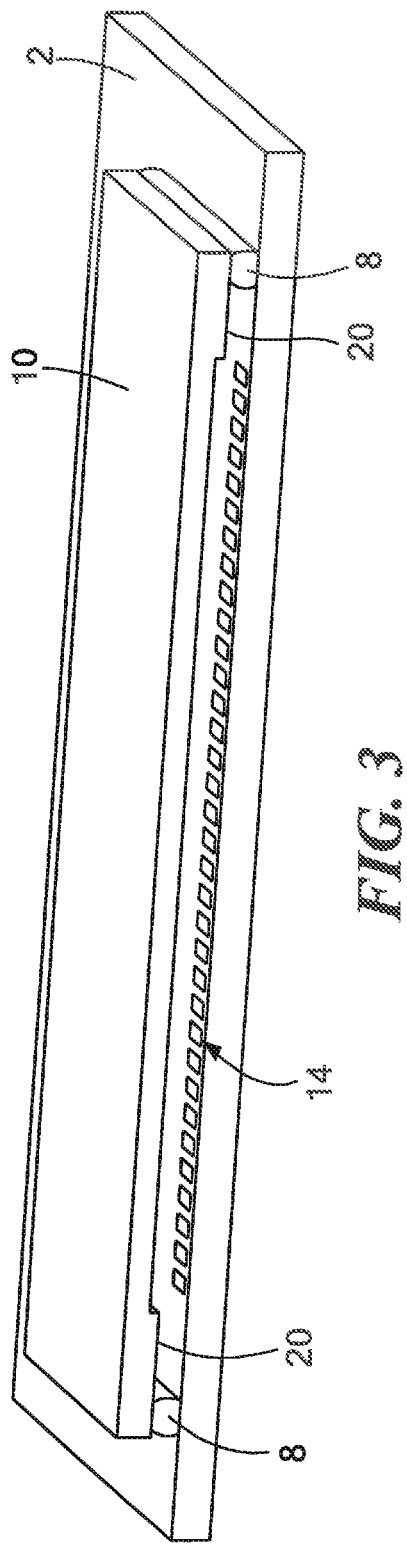
FIG. 3 is a simplified cutaway perspective view of a wafer-level packaged Dewar assembly for an IR detector array in accordance with the disclosure.
Figure 4:
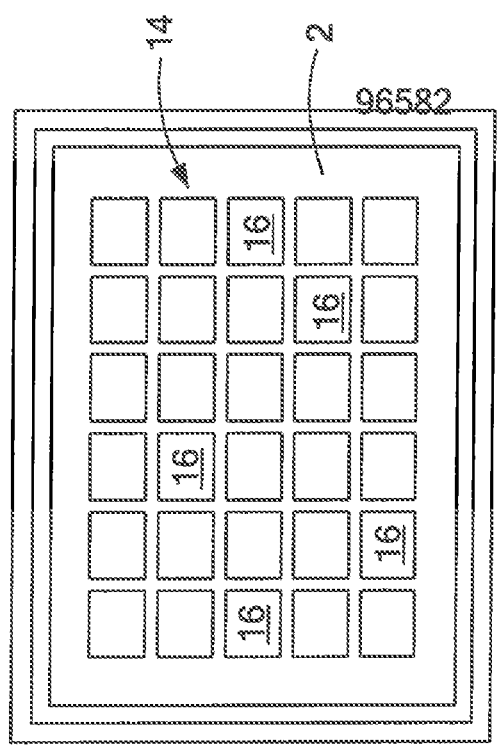
FIG. 4 is a simplified plan of the IR detector array used in the assembly of FIG. 3.

Referring now to FIGS. 3 and 4, a Dewar assembly is shown having a readout integrated circuit (ROIC) substrate 2 of a semiconductor material, preferably silicon. An ER detector array 14 is positioned on the substrate 2 and includes a plurality of individual detector elements, also called pixels, 16. Although FIG. 4 shows only a 5×6 rectangular array of detector pixels 16, it is understood that a typical IR integrated circuit generally includes a planar IR detector array with up to several hundred by several hundred pixels 16, hi most commercial applications, IR detectors are usually uncooled and detect the intensity of IR radiation by sensing increases in temperature which result from the heat imparted to the detectors by the IR radiation. A typical example of an uncooled IR detector is a vanadium oxide (VOx) microbolometer (MB), in which a plurality of individual detectors are usually formed in an array on the ROIC substrate 2 by conventional semiconductor manufacturing processes. The MB array detects IR radiation by sensing the IR-generated heat, and is also called a focal plane array (FPA) or a sensor chip assembly (SCA). The substrate 2 is an integrated circuit used to process the signal produced by the bolometers. In this case the bolometer is a microbridge resistor that changes its resistance when its temperature changes. The incoming radiation causes a change in the temperature of the microbridge. Although other semiconductor materials such as Si may be used, VOx is a commonly available and cost effective material that is used in most commercial IR detection applications.

Figure 6:
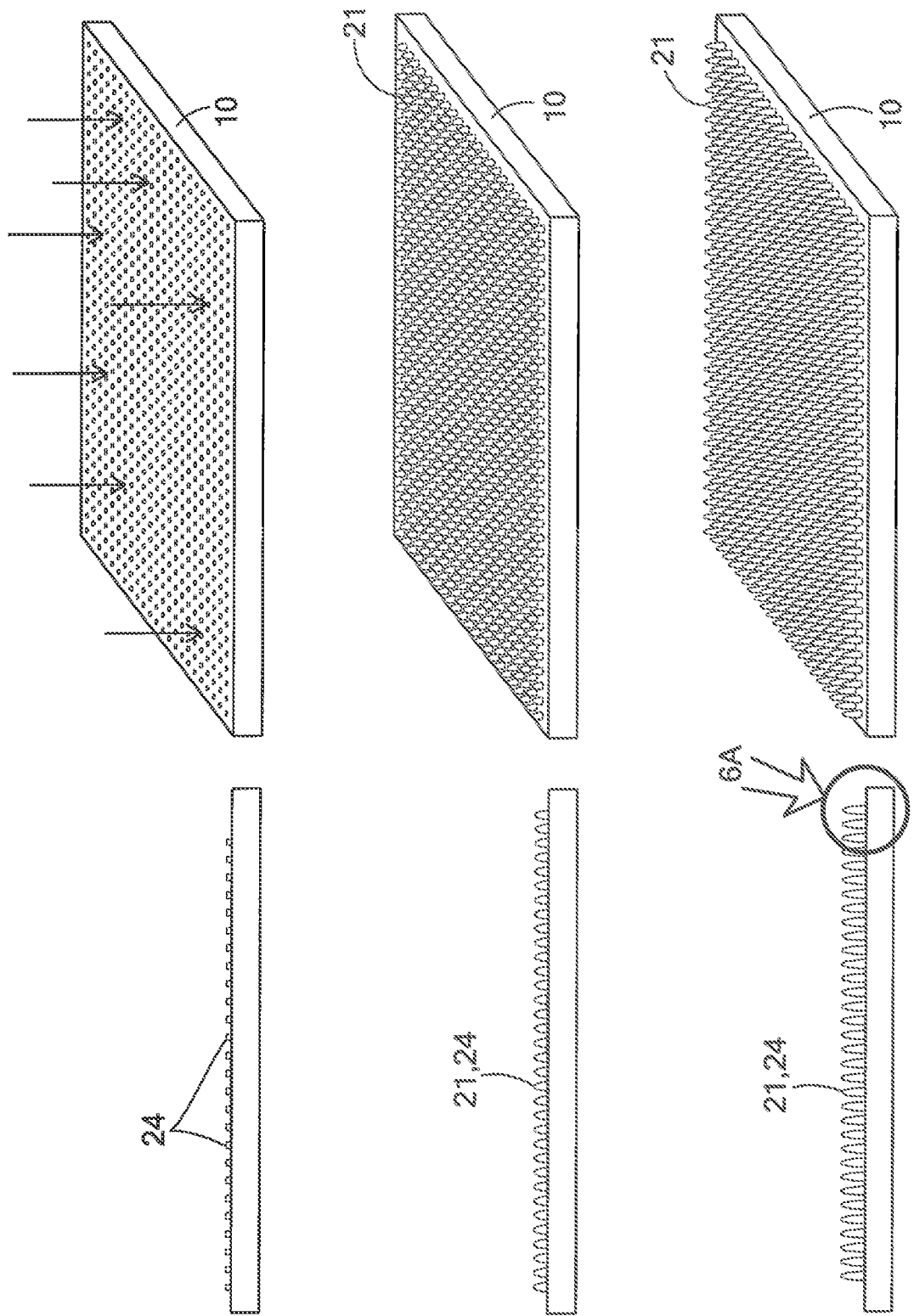
FIG. 6 are sketches showing sequentially from top to bottom, isometric sketches, on the right, and a side elevation views on the left, of a process used to form a plurality of gettering material structures the structures being disposed on a plurality of randomly formed nucleation sites according to the disclosure.

The vacuum-sealed Dewar assembly includes a hermetic seal 8 surrounding the IR detector array to seal off the detector array from the atmosphere. The seal 8 can be, for example, an indium, gold-tin, or other solder, with the height of the seal precisely controlled when it is deposited on the substrate 2 or preferably wafer 10. The seal 8 supports a second substrate, a cap wafer, here an ER transparent window 10, here for example, silicon so that with wafer level packaging the window wafer 10 must have a compatible thermal expansion coefficient with the FPA wafer which is also silicon. The wafer 10 includes: a plurality of columnar gettering material structures 21 (FIG. 6) formed on a predetermined region 20 of the surface of the wafer 10 having a predetermined surface area in a manner to be described. The inner surface of the cap wafer 10 corresponds to the surface 3 in FIGS. 1 and 2. The location of the getter area is shown generally in FIG. 3 as 20, and surrounds the optically transparent IR window. When applied to non-optical WLP packages, a much larger portion of the cap wafer may be covered with getter 21.

Figure 5:
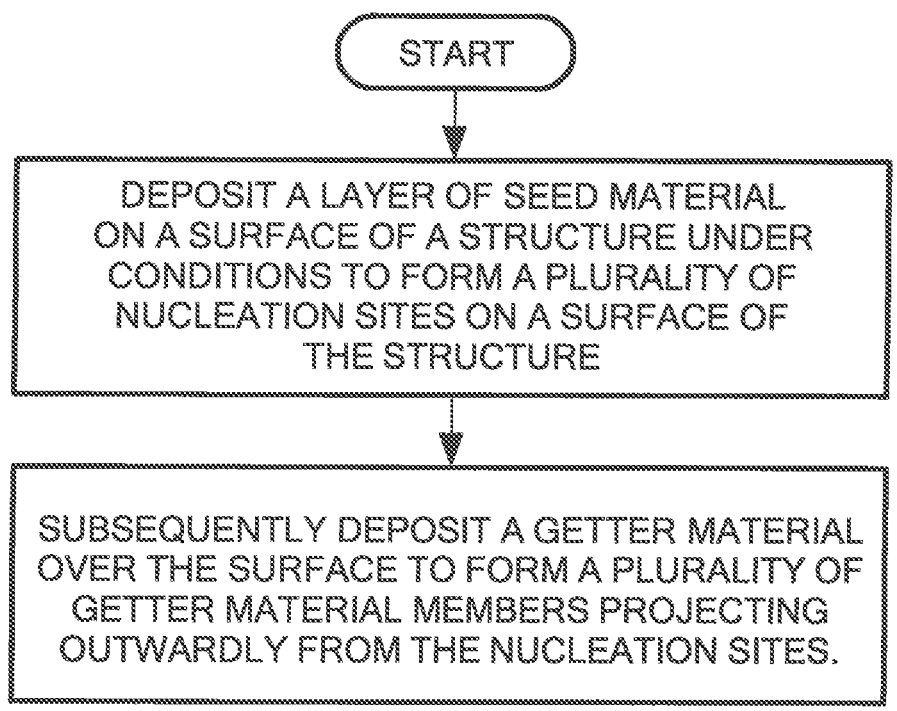
FIG. 5 is a flow chart of as process used to form gettering material according to the disclosure.
Figure 6A:
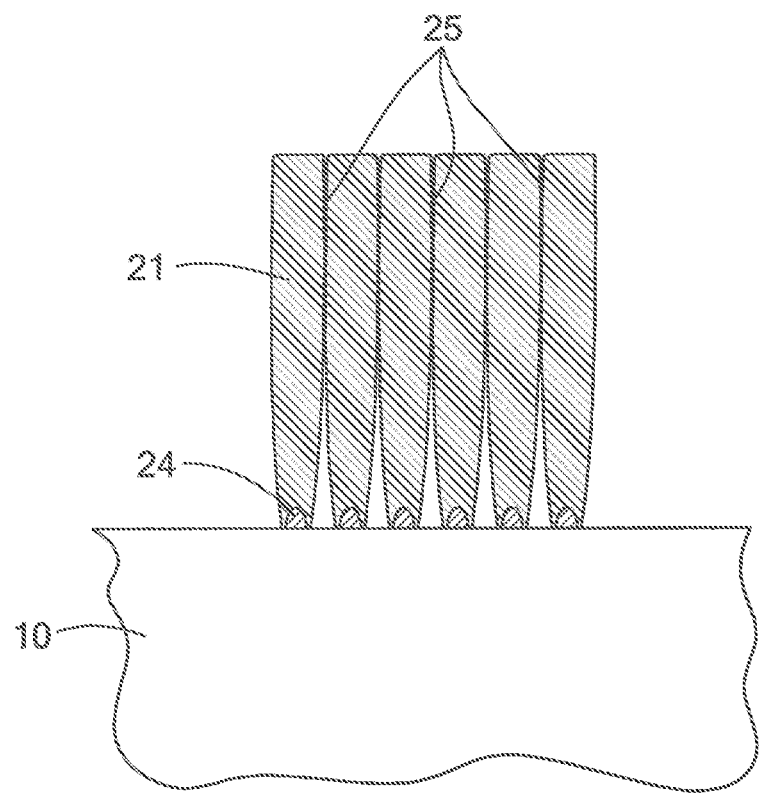
FIG. 6A is a cross section of an exemplary several of the nucleation sites and the getter material thereof of FIG. 6.

More particularly, a flow diagram of a process used to form the columns of getter material 21 is shown in FIG. 5. Briefly, and referring also to FIG. 6 and FIG. 6A, the process includes: forming a plurality of random nucleation sites 24 of a seed material on a predetermined region on the surface of the cap wafer 10; and forming a plurality of getter material members 21 projecting outwardly from the nucleation sites 24. More particularly, the wafer 10 is loaded into a vacuum deposition chamber. A very thin first metal layer, for example, chromium, with an average thickness of less than one molecule (less than a complete monolayer) over the surface area of the predetermined region, is deposited on a surface of the wafer 10 to form the nucleation sites 24 (FIG. 6, FIG. 6A) for a subsequent titanium (Ti) deposition. The Ti layer 21 preferentially grows from grain structure defined by the nucleation sites 24. A requirement for the seed material is that it should have low arrival energy and low surface mobility on a Si wafer 10 surface in order that it will form many small discontinuous clumps of molecules; each clump corresponding to one of the nucleation sites 24. Deposition could be by flash evaporation as by applying a high current pulse through a wire causing it to melt and a portion of it to evaporate, or by thermal evaporation of a measured volume of evaporant, or by shutter controlled electron-beam (e-beam) having a high shutter speed. Deposition by sputtering in a first deposition chamber, then transferring to an electron-beam deposition chamber for the getter deposition may also be used as air exposure will oxidize the nucleation sites, and the getter material (for example, titanium) will adhere to the oxidized sites.

The getter material 1 preferentially grows from gain structure defined by the vas nucleation its 24 to heights in the range of, for example a few thousand Angstroms to a few micrometers. The effectiveness of a getter material 21 is dependent on its effective surface area. The grain boundaries increase the effective area by many times over the geometrical surface and increased area means improved activation under a given set of time-temperature condition. The gettering action works by reacting Ti with molecules in the vacuum which diffuse into the grain boundaries.

The use of materials for the seed material, with higher melting points than the getter material 21 enhances the formation of nucleation sites 24. Therefore, the best candidates for a seed material should have a melting point close to or higher than that of the melting point of the getter material although other metals may be used. In one embodiment, the method includes deposition of the seed material by sputtering, which opens the possibility of using metals that are difficult to evaporate. If the subsequent deposition of a titanium getter layer is done by evaporation, the exposure to air in the transfer between sputtering chamber and evaporation chamber will cause oxidation of the seed material. This is not considered degrading to the getter as the Ti will adhere to metal oxides. The seed material may be, for example, tungsten, tantalum, titanium-tungsten, vanadium, zirconium, ruthenium, molybdenum, hafnium, or chromium. Other possible elements include, for example, silicon, or other metals.

The seed material is not directly involved in the gettering process in which gas atoms are reactively removed from the vacuum environment.

Next, as layer of gettering material, such as for example, titanium having a thickness from about 3000 to more than 10000 Angstroms thick is deposited in-situ over the first metal layer 24, that is over the nucleation site metal. The titanium grows on the nucleation sites into columnar structures having an increasing getter surface area along its sides.

After the formation of the getter material on the nucleation sites, the wafer is removed from the chamber.

A number of embodiments of the disclosure have been described. Nevertheless, it will be understood that various modifications may be made without departing from the spirit and scope of the disclosure. For example, while two different methods are described to achieve the deposition of the nucleation layer, other methods may be used. Further, while the structure and method have been described for a detector array, the method may be applied to other electronic device structures, such as for example, MEMS structures. Accordingly, other embodiments are within the scope of the following claims.

What is claimed is:

1. A getter structure, comprising:
   a substrate;
   a plurality of nucleation sites of a seed material, the seed material being disposed on a surface of the substrate; and
   a plurality of getter material members projecting outwardly from the nucleation sites, the seed material and the getter material being different materials.

2. The getter structure recited in claim 1 wherein the seed material is disposed on a region of the surface of the substrate having a predetermined surface area and wherein the nucleation sites have an average height over the predetermined surface of the surface of the substrate less than one molecule thick.

3. The getter structure recited in claim 2 wherein the getter material is titanium.

4. A vacuum packaged electronic device structure, comprising:
   a first substrate;
   a second substrate vacuum bonded to the first substrate;
   wherein a surface of the second substrate has a plurality of nucleation sites of a seed material disposed on a surface of the second substrate; and
   a plurality of getter material members projecting outwardly from nucleation site, the seed material and the getter material being different materials.

5. The getter structure recited in claim 4 wherein the seed material is disposed on a region of the surface and wherein the nucleation sites have an average height over the predetermined surface of the substrate is less than one molecule thick.

6. The getter structure recited in claim 5 wherein the getter material is titanium.

* * * * *